US010255722B2

(12) United States Patent
Honda

(10) Patent No.: US 10,255,722 B2
(45) Date of Patent: Apr. 9, 2019

(54) METHOD FOR GENERATING CAMERAWORK INFORMATION, APPARATUS FOR GENERATING CAMERAWORK INFORMATION, AND NON-TRANSITORY COMPUTER READABLE MEDIUM

(71) Applicant: Geocreates, Inc., Tokyo (JP)

(72) Inventor: Tsukasa Honda, Tokyo (JP)

(73) Assignee: Geocreates, Inc., Tokyo (JP)

( * ) Notice: Subject to any disclaimer, the term of this patent is extended or adjusted under 35 U.S.C. 154(b) by 85 days.

(21) Appl. No.: 15/246,543

(22) Filed: Aug. 25, 2016

(65) Prior Publication Data

US 2017/0053439 A1 Feb. 23, 2017

Related U.S. Application Data

(63) Continuation of application No. PCT/JP2015/055293, filed on Feb. 24, 2015.

(30) Foreign Application Priority Data

Feb. 28, 2014 (JP) ................................. 2014-039522

(51) Int. Cl.
*G06T 19/00* (2011.01)
*G06F 17/50* (2006.01)

(52) U.S. Cl.
CPC ............ *G06T 19/003* (2013.01); *G06F 17/50* (2013.01); *G06T 19/00* (2013.01);
(Continued)

(58) Field of Classification Search
None
See application file for complete search history.

(56) References Cited

U.S. PATENT DOCUMENTS

2011/0310088 A1   12/2011   Adabala et al.

FOREIGN PATENT DOCUMENTS

| JP | 2004-070522 | 3/2004 |
| JP | 2006-048278 | 2/2006 |
| JP | 2006-350461 | 12/2006 |

OTHER PUBLICATIONS

Li et al. "Automatically generating virtual guided tours." Computer Animation, 1999. Proceedings. IEEE, 1999.*

(Continued)

*Primary Examiner* — Ke Xiao
*Assistant Examiner* — Jed-Justin Imperial
(74) *Attorney, Agent, or Firm* — JCIPRNET

(57) ABSTRACT

A method for generating camerawork information includes extracting, from design information of an architectural structure, a plurality of pieces of space information showing a plurality of spaces related to the architectural structure, specifying a reference line that passes through two connected spaces included in a space shown by a plurality of pieces of extracted space information and is used as a reference when a video image is configured, and generating camerawork information showing time-series information concerning at least one of an image-capturing position, an image-capturing direction, and an image-capturing movement direction in the two spaces on the basis of the specified reference line and the space information corresponding to each of the two spaces for which the reference line is specified.

18 Claims, 13 Drawing Sheets

(52) U.S. Cl.
CPC ............... *G06T 2207/10016* (2013.01); *G06T 2207/30244* (2013.01); *G06T 2210/04* (2013.01)

(56) References Cited

OTHER PUBLICATIONS

Lorenz et al. "A hybrid spatial model for representing indoor environments." International Symposium on Web and Wireless Geographical Information Systems. Springer, Berlin, Heidelberg, 2006.*

* cited by examiner

Camerawork Information

| Time | Cut number | Image-capturing position | Horizontal angle | Vertical angle | Image-capturing movement direction |
|---|---|---|---|---|---|
| t1 | 1 | p1 | $\phi 1$ | $\theta 1$ | (x1,y1) |
| t2 | 1 | p2 | $\phi 2$ | $\theta 2$ | (x2,y2) |
| t3 | 2 | p3 | $\phi 3$ | $\theta 3$ | (x3,y3) |
| ... | ... | ... | ... | ... | ... |

FIG.3

Image-capturing Pattern Information

| Pattern ID | Time | Image-capturing position | Horizontal angle | Vertical angle | Image-capturing movement direction |
|---|---|---|---|---|---|
| 1 | t1 | p | $\phi$ | $\theta$ | (0,0) |
| 1 | t2 | p | $\phi+\Delta\phi$ | $\theta$ | (0,0) |
| 1 | t3 | p | $\phi+2\Delta\phi$ | $\theta$ | (0,0) |
| ... | ... | ... | ... | ... | ... |

FIG.4

Characteristics of Image-capturing Pattern

| Pattern ID | Name of pattern | Point of view of captured video image | Image-capturing position | Image-capturing direction |
|---|---|---|---|---|
| 1 | FIX | first-person, third-person | fixed | fixed |
| 2 | PAN | first-person | fixed | moved |
| 3 | TRAVELLING | first-person, third-person | moved | fixed |
| 4 | TRACKING | third-person | moved | moved |
| 5 | DOLLY | first-person | moved | moved |
| 6 | CRANE | third-person | moved | moved |
| ... | ... | ... | ... | ... |

FIG.6

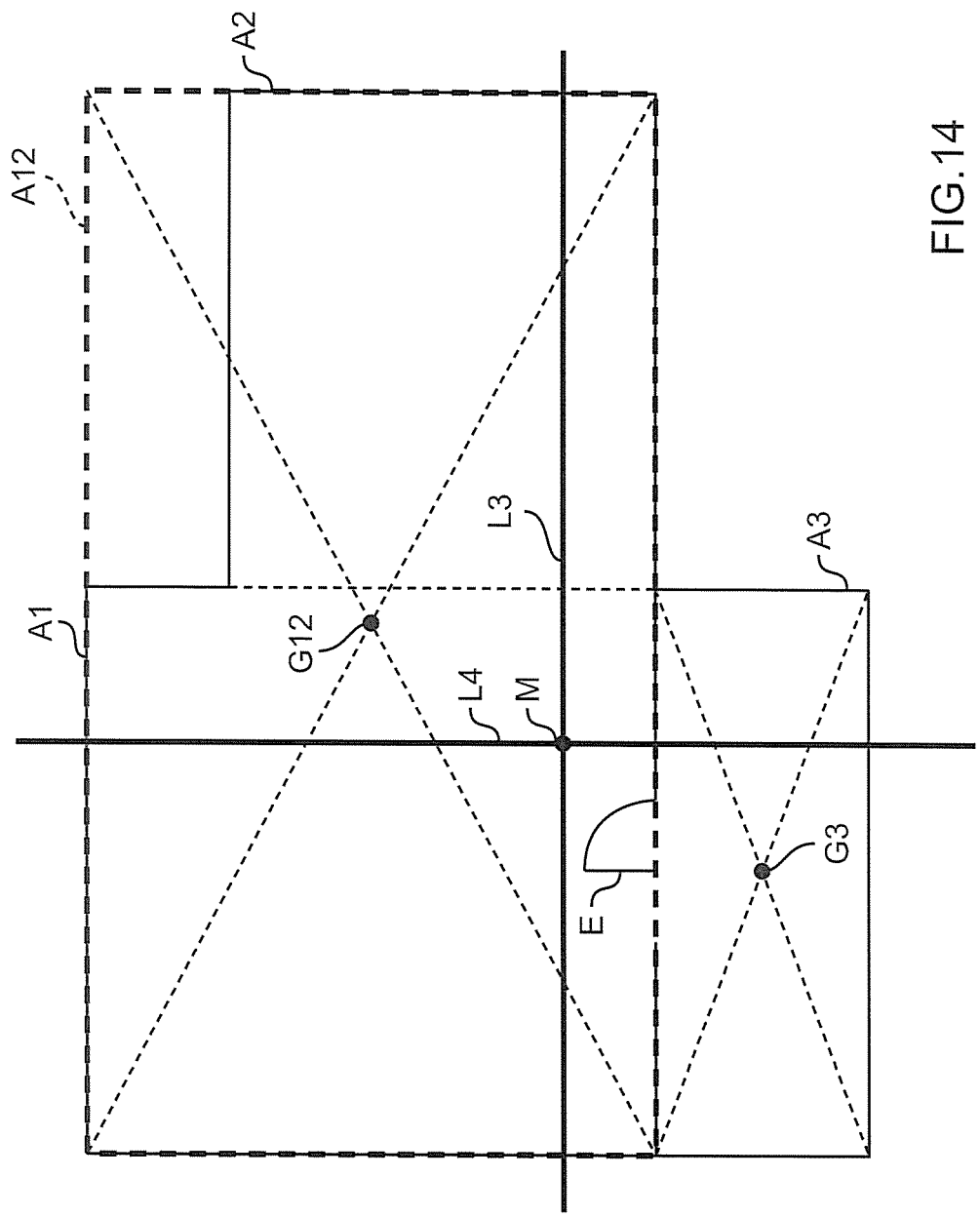

METHOD FOR GENERATING CAMERAWORK INFORMATION, APPARATUS FOR GENERATING CAMERAWORK INFORMATION, AND NON-TRANSITORY COMPUTER READABLE MEDIUM

CROSS-REFERENCE TO RELATED APPLICATIONS

The present application is a continuation application of International Application number PCT/JP2015/055293, filed on Feb. 24, 2015, which claims priority under 35 U.S.C § 119(a) to Japanese Patent Application No. 2014-039522, filed on Feb. 28, 2014. The content of this application is incorporated herein by reference in their entirety.

BACKGROUND OF THE INVENTION

The present invention relates to a method for generating camerawork information, an apparatus for generating camerawork information, and a non-transitory computer readable medium. Conventionally, for the purpose of explaining a designed space, video images that show a three-dimensional model of a space for explaining the space by using computer graphics have been generated, and Japanese Unexamined Patent Application Publication No. 2006-350461 discloses displaying the three-dimensional model of an interior and exterior appearance of a house to be built.

It should be noted that conventional video images for explaining a space were generated by reproducing a point of view of a person who moved in the space. For example, a conventional video image for explaining the space was generated in a situation where the direction of a camera or a camera object was an arbitrary moving direction. A video image generated by such a method has a continuous first-person point of view that ends up with a dull video image configuration. Accordingly, the video image generated by this method lacks comprehensibility due to the difficulty of conveying points that a designer of a space considers to be important and the concept that a designer of the video image of the space wishes to convey to a viewer. Further, since the video image generated by the method tends to have a monotonous rhythm and the viewer gets bored with the video image contents, it becomes difficult for the viewer to have emotional involvement in the video image. On the other hand, it can be considered to change the point of view of the video image at random by randomly changing image-capturing patterns such that the viewer is less likely to get bored and more likely to have emotional involvement in the video image contents. However, even when the point of view of the video image is changed at random, there still is a problem that the video image generated by this method does not fully explain the space to the viewer and lacks comprehensibility.

BRIEF SUMMARY OF THE INVENTION

The present invention aims at providing a method for generating camerawork information, an apparatus for generating camerawork information, and a non-transitory computer readable medium for improving emotional involvement of the viewer by making features of a space designed by a designer and an emotion of the designer put in the space to be conveyed easily to a viewer and the contents is easy to be understood by the viewer.

The inventor of the present invention found out that a video image generated on the basis of a reference line specified for two spaces can be a guide for adjusting a cognitive map imagined by a viewer of the video image, and comprehensibility can be controlled. Further, the inventor of the present invention found out that an emotional involvement of the viewer can be controlled by generating camerawork information showing an image-capturing position, an image-capturing direction, and an image-capturing movement direction that vary with time when a video image for explaining an architectural structure is generated by using a point of view that is associated with the reference line and an image-capturing pattern.

A method for generating camerawork information according to the first aspect of the present invention includes extracting, from design information of an architectural structure, a plurality of pieces of space information showing a plurality of spaces related to the architectural structure, specifying a reference line that passes through two connected spaces included in a space shown by a plurality of pieces of extracted space information, the reference line being a reference when a video image is configured, and generating camerawork information that shows time-series information concerning at least one of an image-capturing position, an image-capturing direction, and an image-capturing movement direction in the two spaces, on the basis of the specified reference line and space information corresponding to each of the two spaces for which the reference line is specified.

An apparatus for generating camerawork information according to the second aspect of the present invention includes an extracting part that extracts, from design information of an architectural structure, a plurality of pieces of space information showing a plurality of spaces related to the architectural structure, a specifying part that specifies a reference line that passes through two connected spaces included in a space shown by the plurality of pieces of extracted space information, the reference line being a reference when a video image is configured, and a generating part that generates camerawork information showing pieces of time-series information concerning at least one of an image-capturing position, an image-capturing direction, and an image-capturing movement direction in the two spaces, on the basis of the specified reference line and the space information corresponding to each of the two spaces for which the reference line is specified.

A non-transitory computer-readable medium according to the third aspect of the present invention stores a camerawork information generating program that causes the computer to function as an extracting part that extracts, from design information of an architectural structure, a plurality of pieces of space information showing a plurality of spaces related to the architectural structure, a specifying part that specifies a reference line that passes through two connected spaces included in a space shown by the plurality of pieces of extracted space information, the reference line being a reference when a video image is configured, and a generating part that generates camerawork information showing time-series information concerning at least one of an image-capturing position, an image-capturing direction, and an image-capturing movement direction in the two spaces, on the basis of the specified reference line and the space information corresponding to each of the two spaces for which the reference line is specified.

BRIEF DESCRIPTION OF THE DRAWINGS

FIG. 3 shows an example of camerawork information according to the first exemplary embodiment.

FIG. 4 shows an example of image-capturing pattern information according to the first exemplary embodiment.

FIG. 6 shows each characteristics of a plurality of image-capturing patterns according to the first exemplary embodiment.

FIG. 14 shows an example that the two connected spaces are assumed as one space.

DETAILED DESCRIPTION OF THE INVENTION

First Exemplary Embodiment

Hereinafter, the first exemplary embodiment of the present invention is explained. Processes of a method for generating camerawork information according to the present exemplary embodiment are executed in a camerawork information generating apparatus 1.

First, the camerawork information generating apparatus 1 executes a process according to an extracting step to extract, from design information of an architectural structure generated by Computer Aided Design (CAD) and Building Information Modeling (BIM), a plurality of pieces of space information showing a plurality of spaces related to the architectural structure. Then, the camerawork information generating apparatus 1 executes a process according to a specifying step to specify a reference line that is used as a reference when a video image is configured for two spaces included in a plurality of spaces. Here, the reference line has a concept similar to that of an imaginary line for connecting two people in conversation when a film or the like is taken. In the present exemplary embodiment, one coordinate is assigned to each of the two connected spaces instead of the people in conversation, and a line that connects the coordinates is determined to be the reference line.

Then, the camerawork information generating apparatus 1 executes a process according to a generating step to generate camerawork information including time-series information of an image-capturing position, image-capturing direction, and image-capturing movement direction in the two spaces on the basis of the reference line and space information of the two spaces. Subsequently, the camerawork information generating apparatus 1 executes a process according to a video image generating step to generate a video image by rendering a video image of a three-dimensional model space including a model of an architectural structure.

Figure 1:
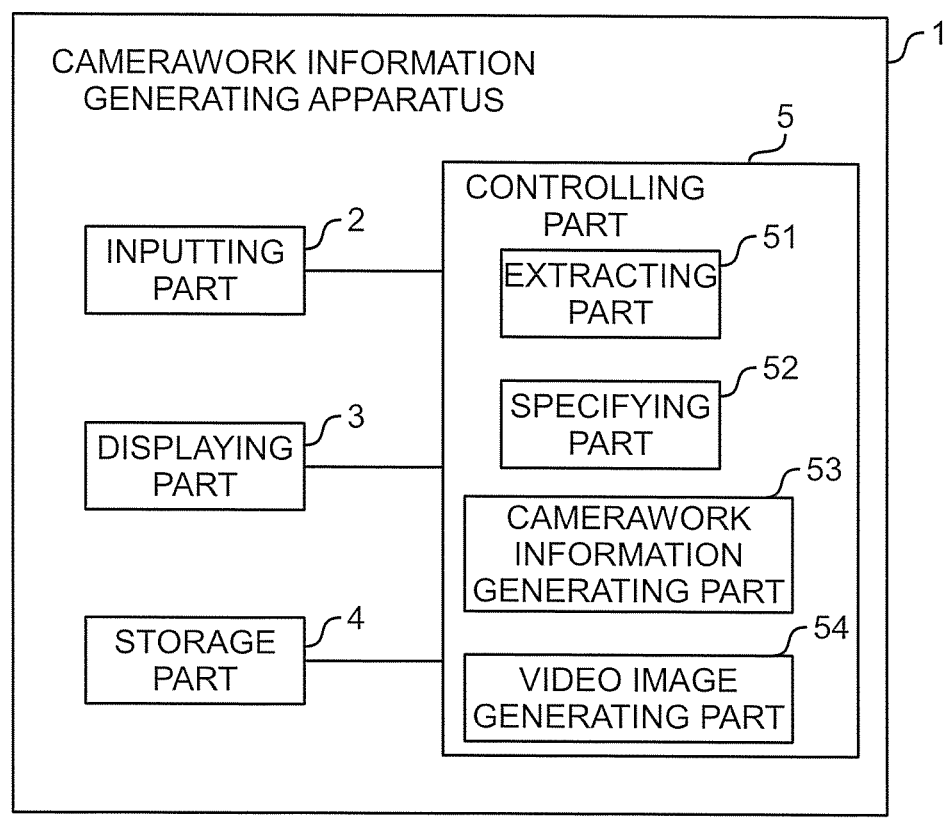
FIG. 1 shows a configuration of a camerawork information generating apparatus according to the first exemplary embodiment.

FIG. 1 shows a configuration of the camerawork information generating apparatus 1 according to the present exemplary embodiment. The camerawork information generating apparatus 1 comprises an inputting part 2, a displaying part 3, a storage part 4, and a controlling part 5. The inputting part 2 includes, for example, a keyboard, a mouse, and the like. The inputting part 2 accepts an operation input from an operator of the camerawork information generating apparatus 1. The displaying part 3 includes, for example, a liquid crystal display, an Electro-Luminescence (EL) display, and the like. The displaying part 3 displays, for example, design information, camerawork information, and the like of an architectural structure in accordance with control of the controlling part 5.

The storage part 4 includes, for example, a Read Only Memory (ROM), a Random Access Memory (RAM), a hard disk, and an external storage device such as a storage medium that is connected to the camerawork information generating apparatus 1, and the like. Here, the external storage device may be directly connected to the camerawork information generating apparatus 1 or may be connected through a communication network (not shown in figure) so as to communicate with it.

Further, the storage part 4 stores design information of an architectural structure and camerawork information. Furthermore, the storage part 4 stores the camerawork information generating program that causes a computer to function as an extracting part 51, a specifying part 52, a camerawork information generating part 53, and a video image generating part 54, which are described below. Moreover, the storage part 4 stores a three-dimensional computer graphics (CG) program for generating three-dimensional CG.

The controlling part 5 includes, for example, a computer processing unit (CPU) and controls the camerawork information generating apparatus 1. The controlling part 5 functions as the extracting part 51, the specifying part 52, the camerawork information generating part 53, and the video image generating part 54 by executing the camerawork information generating program stored in the storage part 4.

Figure 2:
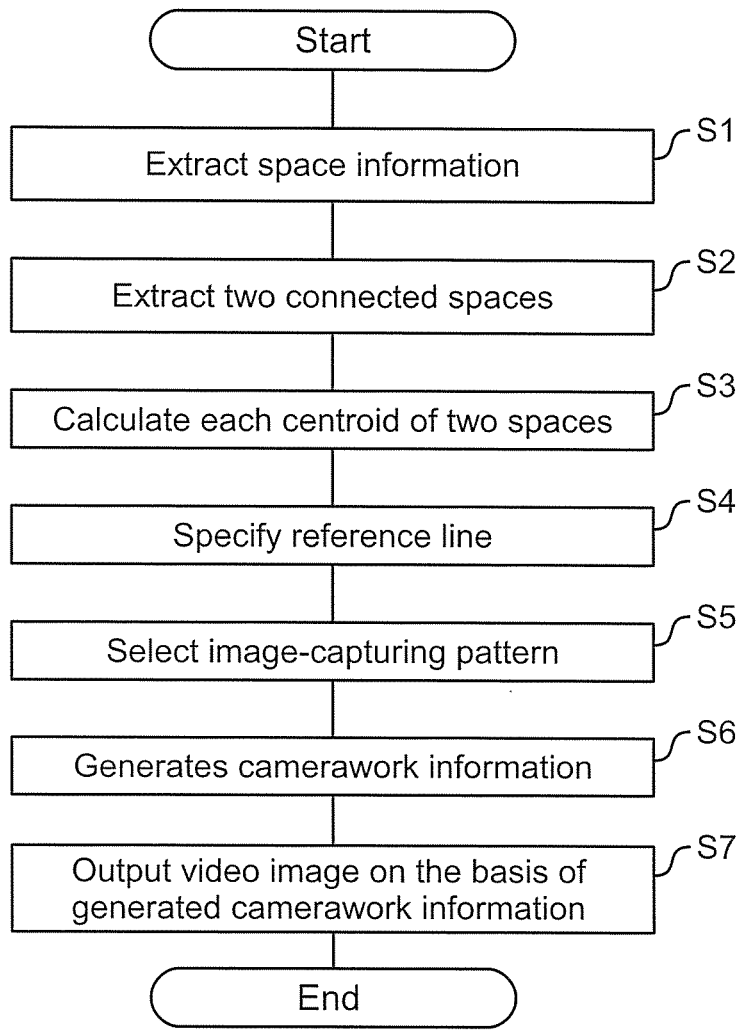
FIG. 2 shows a flowchart showing a processing flow for generating video image data by using the camerawork information generating apparatus according to the first exemplary embodiment.

Next, a specific processing flow of the method for generating camerawork information is explained by explaining the detailed functions of the extracting part 51, the specifying part 52, the camerawork information generating part 53, and the video image generating part 54. FIG. 2 shows a flowchart showing the processing flow for generating video image data by using the method for generating camerawork information according to the present exemplary embodiment.

First, the extracting part 51 of the controlling part 5 executes a process according to the extracting step to extract, from design information of an architectural structure, a plurality of pieces of space information showing a plurality of spaces related to the architectural structure (S1). Specifically, according to, for example, the operation of the user of the camerawork information generating apparatus 1, the extracting part 51 accepts the design information of the architectural structure such as three-dimensional CAD and BIM and perspective information showing a perspective of the architectural structure generated in advance by the designer. Then, the extracting part 51 analyzes the design information and the perspective information, and extracts the plurality of pieces of space information showing the plurality of spaces related to the architectural structure. Here, the extracting part 51 does not have to extract only the space information showing the inside of the architectural structure, and may also specify one space outside of the architectural structure adjoining the architectural structure to extract the space information showing the one space.

Next, the controlling part 5 generates a model of an architectural structure corresponding to the design information accepted in the extracting step by using a three-dimensional CG program. Specifically, the controlling part 5 generates a space model in the three-dimensional CG program, and generates the model of the architectural structure inside of the space model on the basis of the space information extracted in the extracting step. It should be noted that the model of the architectural structure does not have to be generated by the controlling part 5 but may be generated by, for example, the user of the camerawork information generating apparatus 1. Further, the controlling part 5 may obtain the model of the architectural structure generated by another device from this other device. In such a case, the extracting part 51 may extract the space information related to the architectural structure from a generated model of the architectural structure or an obtained model of the architectural structure.

Subsequently, the specifying part 52 of the controlling part 5 executes a process according to the specifying step to specify the reference line, which is a reference used in configuring the video image, that is included in the space shown by the plurality of pieces of extracted space information and that passes through each centroid of the two connected spaces (S2 to S4).

Specifically, the specifying part 52 extracts the two connected spaces on the basis of the plurality of pieces of space information extracted in the extracting step (S2). Here, the two connected spaces are, for example, two spaces that are adjacent to each other and are connected by an opening or the like among the plurality of spaces shown by the plurality of pieces of space information.

Next, the specifying part 52 extracts dimensional information of the space from, for example, property information in the three-dimensional CAD, BIM, and the like of the two spaces, and calculates the coordinates that show each centroid of the two connected spaces on the basis of the dimensional information (S3). Here, when the property information in the three-dimensional CAD, BIM, and the like includes information showing the coordinate of the centroids, the specifying part 52 may obtain the information. Subsequently, the specifying part 52 specifies a segment that starts from a coordinate of one centroid and ends at a coordinate of another centroid as a reference line. Here, the specifying part 52 may specify a straight line that passes through coordinates of two centroids. Then, the specifying part 52 draws the reference line in the space model including a model of the architectural structure (S4).

It should be noted that the user of the camerawork information generating apparatus 1 may obtain in advance the information related to the space that the designer of an architectural structure considers to be important and may designate the two connected spaces corresponding to the space. In this manner, the specifying part 52 can set the reference line for the two spaces corresponding to the designated space.

Next, the camerawork information generating part 53 of the controlling part 5 executes a process according to the generating step to generate camerawork information of a camera object for rendering computer graphics of a space model, that is provided to the space model generated by the three dimensional CG program (S5, S6). Here, the camerawork information includes time-series information concerning at least one of an image-capturing position, an image-capturing direction, and an image-capturing movement direction in the two spaces corresponding to a model of the architectural structure included in the space model. This image-capturing direction is specified by a horizontal angle and a vertical angle with respect to a reference direction. Here, the horizontal angle is an angle with respect to a predetermined direction and the vertical angle is an angle measured vertically by assuming a horizontal plane passing through the camera object as a reference.

FIG. 3 shows an example of the camerawork information according to the present exemplary embodiment. As shown in FIG. 3, the camerawork information includes a plurality of pieces of unit information in which a time, a cut number, an image-capturing position, a horizontal angle, an angle of elevation, and an image-capturing movement direction are associated with each other.

The cut number is information for specifying a cut showing a series of video images that are continuously captured. For example, in a case where the camera object is moved on the basis of the unit information in which the cut number is the same, the camera object is continuously moved on the basis of the image-capturing movement direction. In the example shown in FIG. 3, because the cut numbers of two pieces of unit information are "1," the camera object is positioned at a position p1 at a time t1, and then is continuously moved to a position p2 at a time t2. Further, the position of the camera object is changed when the cut number is changed. In the example shown in FIG. 3, when the cut number changed from "1" to "2," the camera object is not continuously moved from the position p2 to a position p3, but is changed from the position p2 to the position p3. It should be noted that the unit information of the camerawork information may include a focal length and a depth of field of the camera object.

The camerawork information generating part 53 generates the camerawork information on the basis of the reference line that has been specified in the specifying step and the space information corresponding to each of the two spaces for which the reference line has been specified.

More specifically, the storage part 11 stores image-capturing pattern information showing a plurality of image-capturing patterns showing a variation pattern of at least one of the previously specified age-capturing position, image-capturing direction, and image-capturing movement direction. FIG. 4 shows an example of the image-capturing pattern information according to the present exemplary embodiment. As shown in FIG. 4, the image-capturing pattern information includes a plurality of pieces of unit information in which a pattern ID for identifying a pattern, a time, an image-capturing position, a horizontal angle, an angle of elevation, and an image-capturing movement direction are associated with each other.

The age-capturing pattern includes, for example, i) FIX: none of the image-capturing position, image-capturing direction, and image-capturing movement direction of the camera object are changed, ii) PAN: the horizontal angle of the camera object is changed without changing the image-capturing position and the vertical angle, iii) TILT (also referred to as pan-up and pan-down): the vertical angle is changed without changing the image-capturing position and the horizontal angle, v) DOLLY: the image-capturing position is changed without changing the horizontal angle and the vertical angle by holding the camera by hand, making the camera slide on a rail, or the like while keeping the camera facing the front, v) TRACKING: the image-capturing position is laterally moved without changing the horizontal angle and the vertical angle by moving the camera such as by sliding on the rail, vi) CRANE: the image-capturing position is three-dimensionally changed by using a camera crane. For example, the example shown in FIG. 4 shows "PAN" and only the horizontal angle is changed according to the change of time.

The camerawork information generating part 53 specifies shapes of the two spaces for which the reference line has been specified by referring to, for example, the property information in the three-dimensional CAD, BIM, and the like, and selects one image-capturing pattern from the plurality of image-capturing patterns on the basis of the specified shapes (S5). For example, the storage part 4 stores shape information that shows a shape of a space and the image-capturing pattern information in association with each other, and the camerawork information generating part 53 selects the image-capturing pattern corresponding to the specified shapes. Then, the camerawork information generating part 53 generates the camerawork information on the basis of the selected image-capturing pattern and the reference line. It should be noted that the camerawork information generating part 53 may obtain information showing the shapes through the inputting part 2 when the shapes of the two spaces are specified.

For example, when the shape of at least one of the two spaces shows a corridor, the camerawork information generating part 53 selects "PAN" for the image-capturing pattern. Further, when the shape of at least one of the two spaces shows a hall, the camerawork information generating part 53 selects "TILT" for the image-capturing pattern.

After one image-capturing pattern is selected for the two spaces for which the reference line has been specified, the camerawork information generating part 53 determines an image-capturing start position of the camera object corresponding to a first cut of the space model on the basis of the reference line. For example, on the basis of the viewer's capturing of the coordinates in the space, the camerawork information generating part 53 specifies an arbitrary position and an arbitrary direction within a predetermined distance from the reference line as the image-capturing start position of the camera object. Here, the camerawork information generating part 53 may specify, for example, the image-capturing start position and the image-capturing direction of the camera object corresponding to the first cut with a composition intended to include many guides of the space including the centroids that are reference points of the reference line. Here when a still image perspective is accepted in S1, the camerawork information generating part 53 may specify the image-capturing start position and the image-capturing direction of the camera object on the basis of the image shown by the still image perspective. Further, the image-capturing direction of the camera object corresponding to the first cut is preferred to be directed to the reference line from the image-capturing position or preferred to be directed opposite to this direction. The camerawork information generating part 53 may accept the image-capturing start position, image-capturing direction (the horizontal angle and the vertical angle), and image-capturing movement direction of the camera object corresponding to the first cut from a user of the camerawork information generating apparatus 1 through the inputting part 2. The camerawork information generating part 53 generates the camerawork information by giving the cut number to the selected image-capturing pattern and by applying the determined image-capturing position, the horizontal angle, and the vertical angle to the selected image-capturing pattern (S6).

Figure 5:
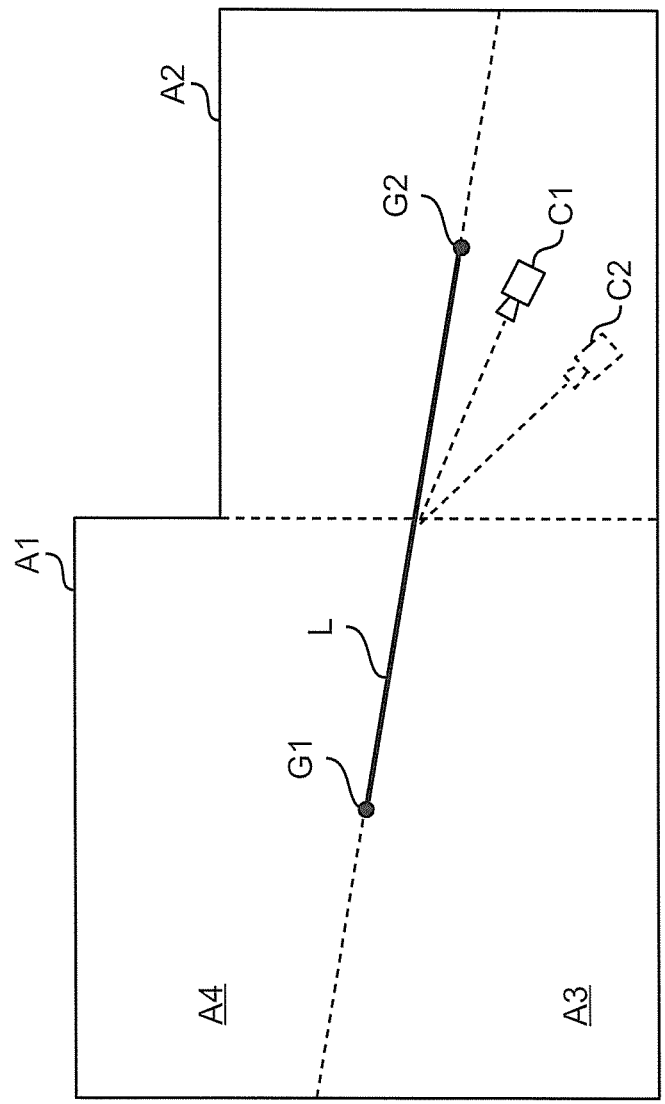
FIG. 5 shows a planar view illustrating an example of an image-capturing position of a camera corresponding to the first cut in two connected spaces according to the first exemplary embodiment.

FIG. 5 shows a planar view illustrating an example of an image-capturing position of a camera corresponding to the first cut of two connected spaces. Because horizontal movement tends to be dominant in the cognitive map of people, an explanation regarding vertical movement of a camera is omitted and horizontal movement of the camera is focused on and explained here. In a planar view shown in FIG. 5, a reference line L is specified on the basis of centroids G1 and G2 of two respective spaces A1 and A2. Then, the spaces A1 and A2 are divided into two regions A3 and A4, with the reference line L and an extended line from the reference line L as boundaries. The camerawork information generating part 53 generates the camerawork information in which the image-capturing start position of the camera object corresponding to the first cut is set on the side of region A3. For example, the camerawork information for moving the position of the camera object from C1 to C2 is generated for the first cut.

Next, the camerawork information generating part 53 generates the camerawork information corresponding to a second cut by deciding the image-capturing start position, image-capturing direction, and image-capturing movement direction of the camera object corresponding to the second cut. The camerawork information generating part 53 selects the image-capturing pattern that corresponds to the second cut on the basis of the type of point-of-view associated with the plurality of previously specified image-capturing patterns. FIG. 6 shows each characteristics of the plurality of image-capturing patterns according to the present exemplary embodiment. As shown in FIG. 6, a pattern ID of each pattern is associated with a pattern name, information showing the point of view of the video image captured by the said image-capturing pattern, image-capturing position, and image-capturing direction.

Here, a first-person point-of-view video image is a video image according to the sight of a person, that is, a video image captured by a person standing and sitting. A third-person point-of-view video image is a video image captured from a position higher or lower than the sight of a person. The third-person point-of-view video image allows a viewer to broadly capture a space in a single screen, and information included in the screen can be increased compared with the first-person point-of-view video image. Accordingly, the third-person point-of-view video image can facilitate creation of the cognitive map imagined by the viewer, explain comprehensibility of the video image, and vary a rhythm of the video image by changing the point of view of the image from the point of view of the first person. The camerawork information generating part 53 can give a rhythm to the video image by changing the point of view of the video image to prevent the first-person point-of-view video image and the third-person point-of-view video image from continuing for a predetermined number of times or more, such that the viewer is less likely to get bored and more likely to have emotional involvement in the video image.

Here, the camerawork information generating apparatus 1 may be a wearable computer worn by a viewer (experiencing person) that is capable of obtaining a viewing log. Further, the inputting part 2 of the camerawork information generating apparatus 1 may be the wearable computer. In this case, when the point of view of the video image is the first-person view, the camerawork information generating part 53 can specify an action of the viewer such as an angle of the sight of the viewer looking around in the space on the basis of the viewing log obtained by the wearable computer and can generate camerawork information on the basis of the action. In this manner, the camerawork information generating part 53 can make a video image that matches with the action of the experiencing person and can facilitate emotional involvement of the viewer.

Furthermore, the storage part 4 of the camerawork information generating apparatus 1 may have installed therein a database for accumulating the viewing log obtained from the wearable computer. In this case, the camerawork information generating part 53 can calculate the averaged numerical value of the action of the viewer such as the angle of the sight of the viewer looking around in the space on the basis of the viewing log accumulated in the database to specify a standard action and can generate the camerawork information on the basis of the standard action. The standard camerawork obtained in such a manner can improve the emotional involvement of the viewer because it can express a standard visual recognition of a person by increasing the number of samples in the database. Further, combination of a plurality of standard cameraworks obtained in such a manner can give a steady rhythm to a series of video images.

Furthermore, the camerawork information generating part 53 preferably generates the camerawork information containing the plurality of image-capturing positions on the same side with the reference line as a reference. In such a manner, the camerawork information generating part 53 allows the viewer of the video image generated by the camerawork information to capture the video image as an expansion of the same cognition map and can improve comprehensibility of the video image. Moreover, the camerawork information generating part 53 can also give an attractive rhythm to the video image to facilitate the emotional involvement of the viewer by generating the camerawork information containing the plurality of image-capturing positions.

The camerawork information generating part 53 may generate camerawork information containing the image-capturing position that is equal to or farther than the predetermined range with respect to the image-capturing position of a capturing immediately before. For example, when an image-capturing end position of the camera object corresponding to the first cut is arranged in the region A3 as shown in FIG. 5, the camerawork information generating part 53 determines the image-capturing start position corresponding to the second camerawork information to be a position that is far from a predetermined distance or more from the image-capturing end position, which is included in the region A3 on the same side as the image-capturing position of the camera corresponding to the first cut with the reference line as a reference. Here, the image-capturing direction of the camera object corresponding to the second camerawork information is preferably included in the range from the image-capturing position to the reference line that is similar to the image-capturing direction of the camera object corresponding to the first cut.

Figure 7:
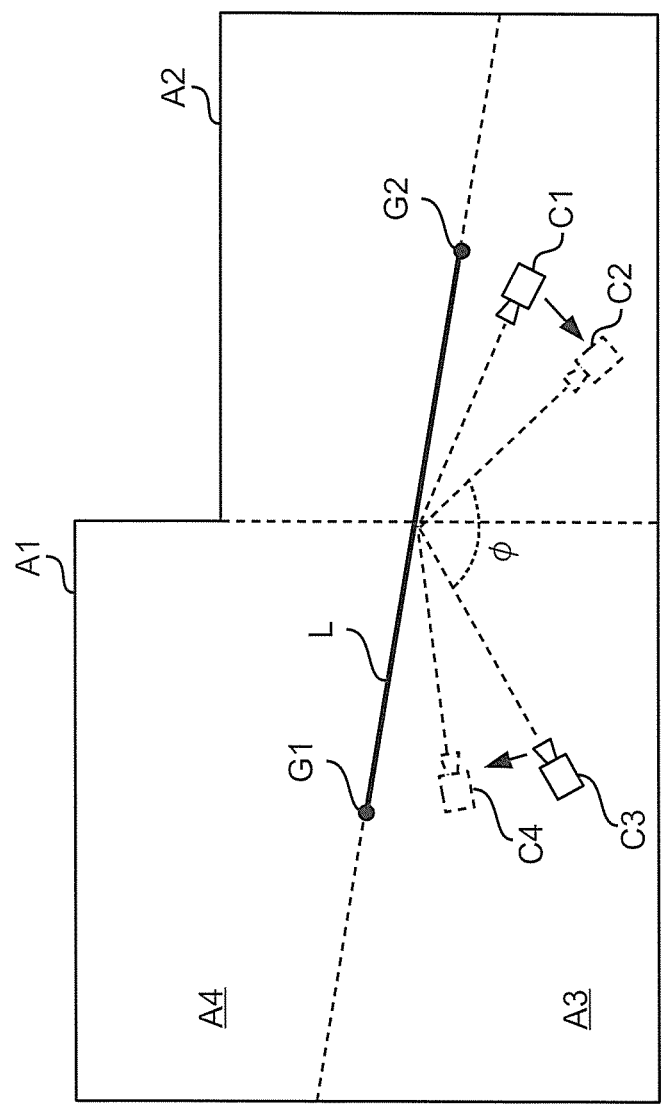
FIG. 7 shows a planar view illustrating an example of an image-capturing position of the camera corresponding to the second cut in addition to the image-capturing position of the camera corresponding to the first cut shown in FIG. 5.

FIG. 7 shows a planar view illustrating an example of added image-capturing positions of the camera corresponding to the second cut in addition to the image-capturing positions of the camera corresponding to the first cut shown in FIG. 5. As shown in FIG. 7, the camerawork information generating part 53 determines an image-capturing start position C3 of the camera object corresponding to the second cut to be at a position outside of the predetermined range from the image-capturing end position C2 of the camera object corresponding to the first cut on the region A3 side. For example, the camerawork information generating part 53 generates the camerawork information in which the position of the camera object is moved from C3 to C4 corresponding to the second cut.

The camerawork information generating part 53 may generate the camerawork information containing the image-capturing direction that is at a predetermined angle or more away from the image-capturing direction of a capturing performed immediately before. For example, the camerawork information is generated such that an angle between the horizontal angle of the camera object at the image-capturing start position of the second cut and the horizontal angle of the camera object at the image-capturing end position of the first cut (a cut of a capturing performed immediately before) is equal to or larger than a predetermined angle (for example, 30° or more). In FIG. 7, the angle $\varphi$ between the horizontal angle of the camera object at the image-capturing start position C3 of the second cut and the horizontal angle of the camera object at the image-capturing end position C2 of the first cut is recognized to be equal to or larger than the predetermined angle.

It should be noted that the camerawork information generating part 53 may allow the angle $\varphi$ to be within the predetermined angle. In this manner, because the space is captured from a similar point of view, the camerawork information generating apparatus 1 can improve the comprehensibility of the space and can contribute to adjusting the cognitive map imagined by the viewer. Here, the camerawork information generating part 53 preferably causes the angle $\varphi$ and the vertical angle $\theta$ to be within the predetermined angle. It should be noted that when the space to be explained is shifted, the camerawork information generating part 53 shifts the centroid (starting point, end point) of the reference line on the basis of the shifted space and arranges the camera object in the shifted space such that the image-capturing direction of the camera object is directed towards the reference line. In this manner, the camerawork information generating apparatus 1 can configure a moving image in which the camera object is effectively changed without breaking the cognitive map imagined by the viewer.

Figure 8:
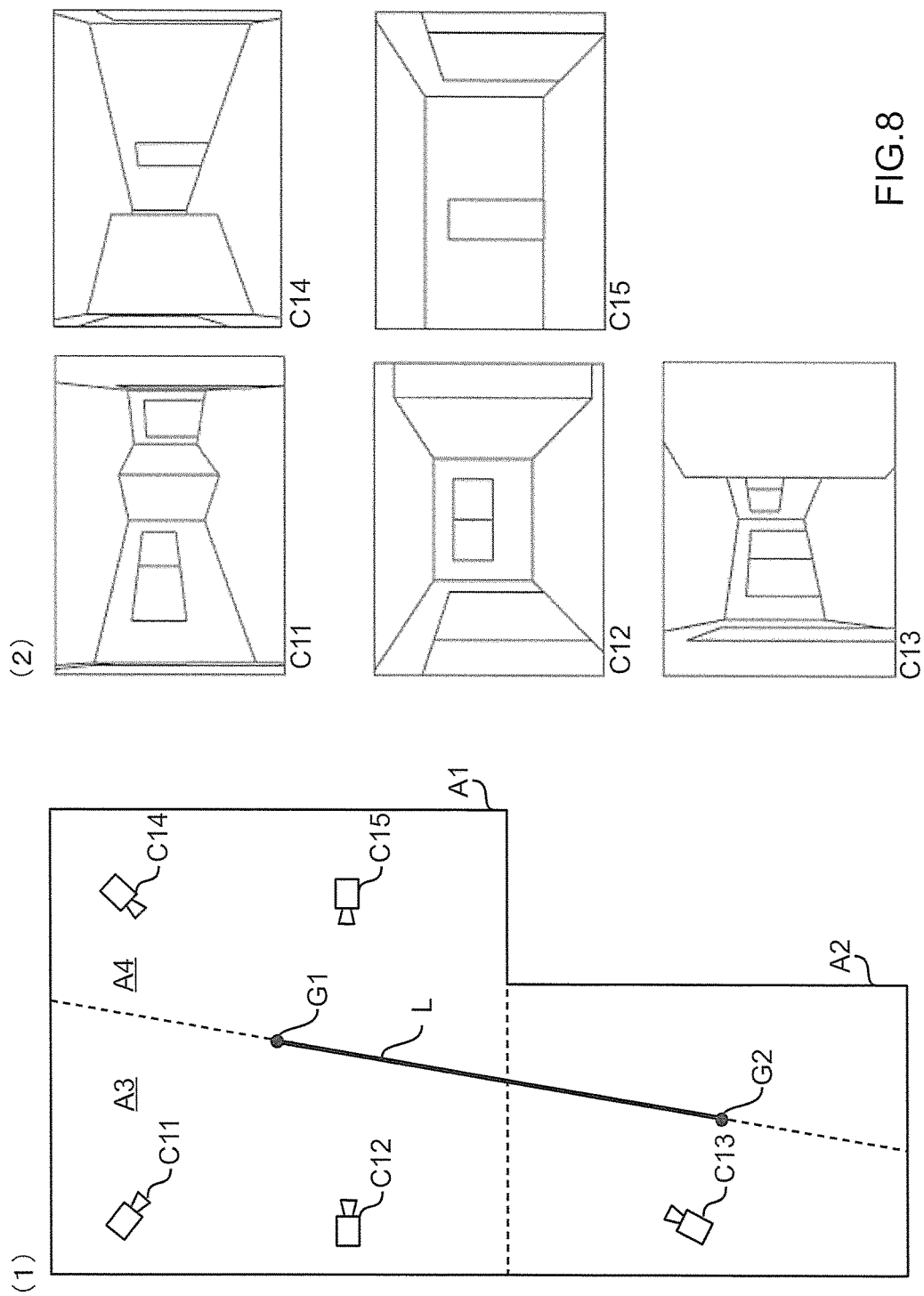
FIGS. 8A-8C show an arrangement example of a camera object and examples of images captured from each arrangement position according to the first exemplary embodiment.

FIGS. 8A-8C show an arrangement example of the camera object and examples of images captured from each arrangement position. Specifically, FIG. 8A shows C11 to C15 as examples of the arrangement positions and the image-capturing directions of the camera object in two spaces A1 and A2. FIG. 8B shows the images taken at C11 to C15. For example, because changing the video image i) from the one captured at C12 to the one captured at C11 and ii) from the one captured at C12 to the one captured at C13 allows the viewer to recognize continuity, and because the point of view is directed towards the reference line in the area A3, the space can be comprehended as an expansion of a series of cognitive maps and can be easily understood. On the other hand, changing the video image i) from the one captured at C11 to the one captured at C14 and ii) from the one captured at C11 to the one captured at C15 makes the viewer recognize a discontinuity. Further, because the point of view moves from the area A3 to the area A4 beyond the reference line, the cognitive map is broken and the space cannot be comprehended and is difficult to understand.

Next, the video image generating part 54 of the controlling part 5 executes a process according to a video image generating step to generate video image data by rendering a model of an architectural structure arranged on a space model generated in the three-dimensional CG program on the basis of the camerawork information generated in the generating step (S7).

Specifically, the video image generating part 54 moves the camera object in a sequential order on the basis of the camerawork information generated for each of the two spaces for which the reference line is specified. Then, the video image generating part 54 generates the video image data by rendering the video image obtained from the camera object that is moving and capturing the outside and the inside of the architectural structure arranged in the space model. And then, the video image generating part 54 stores the generated video image data in the storage part 4. In this manner, the plurality of video images, which are captured by the camerawork information generated with respect to one reference line, are highly related to each other. Further, the viewer of the video image can gradually adjust the cognitive maps he/she imagines while guessing which video image corresponds to the place in the spaces when he/she watches the plurality of video images. Accordingly, the viewer of the video image can deeply comprehend the architectural structure included in the video image.

[An Example of Generating the Video Image]

Figure 9:
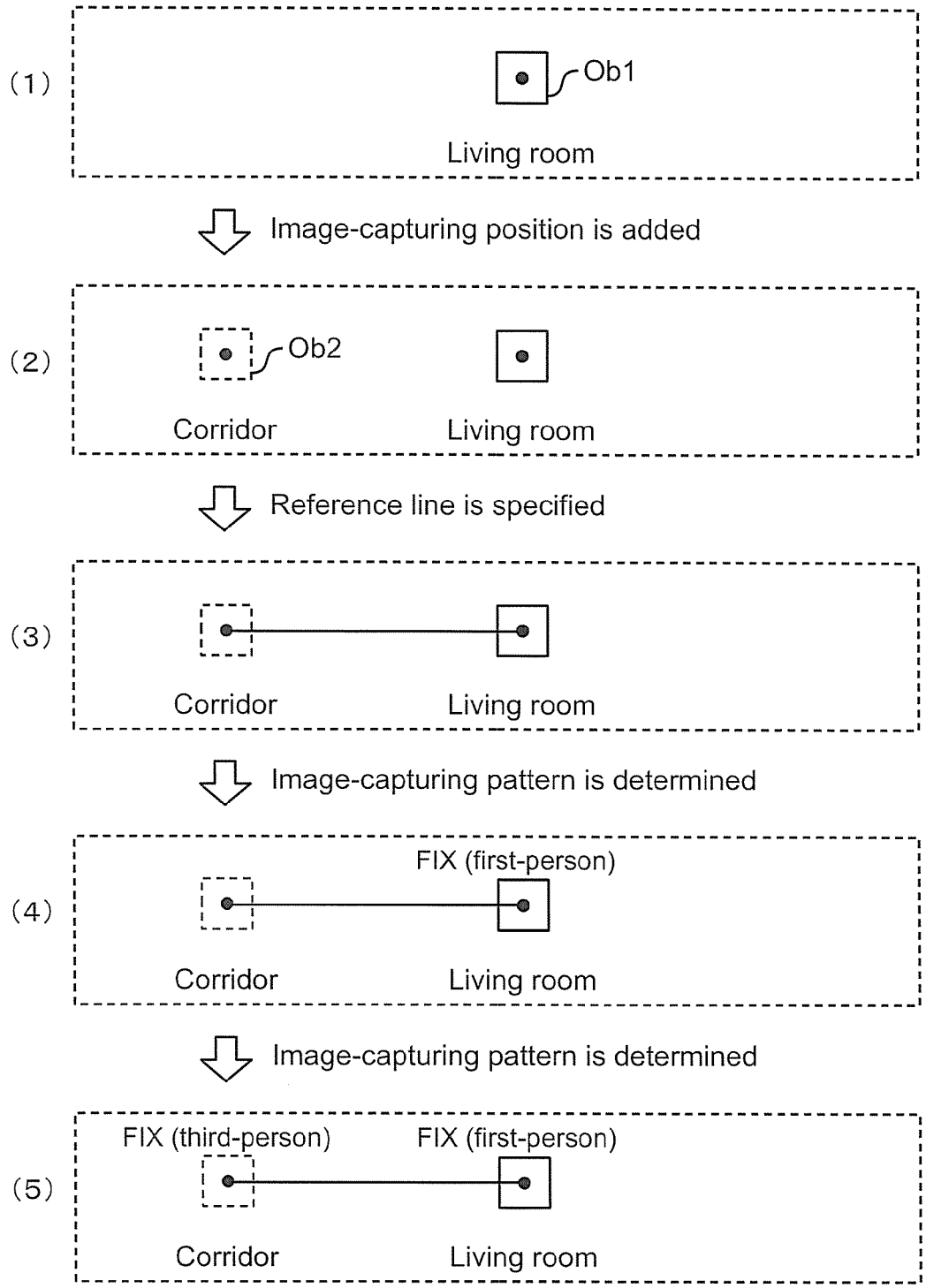
FIG. 9 shows a diagram (Part 1) for explaining an example of a generated video image according to the first exemplary embodiment.
Figure 10:
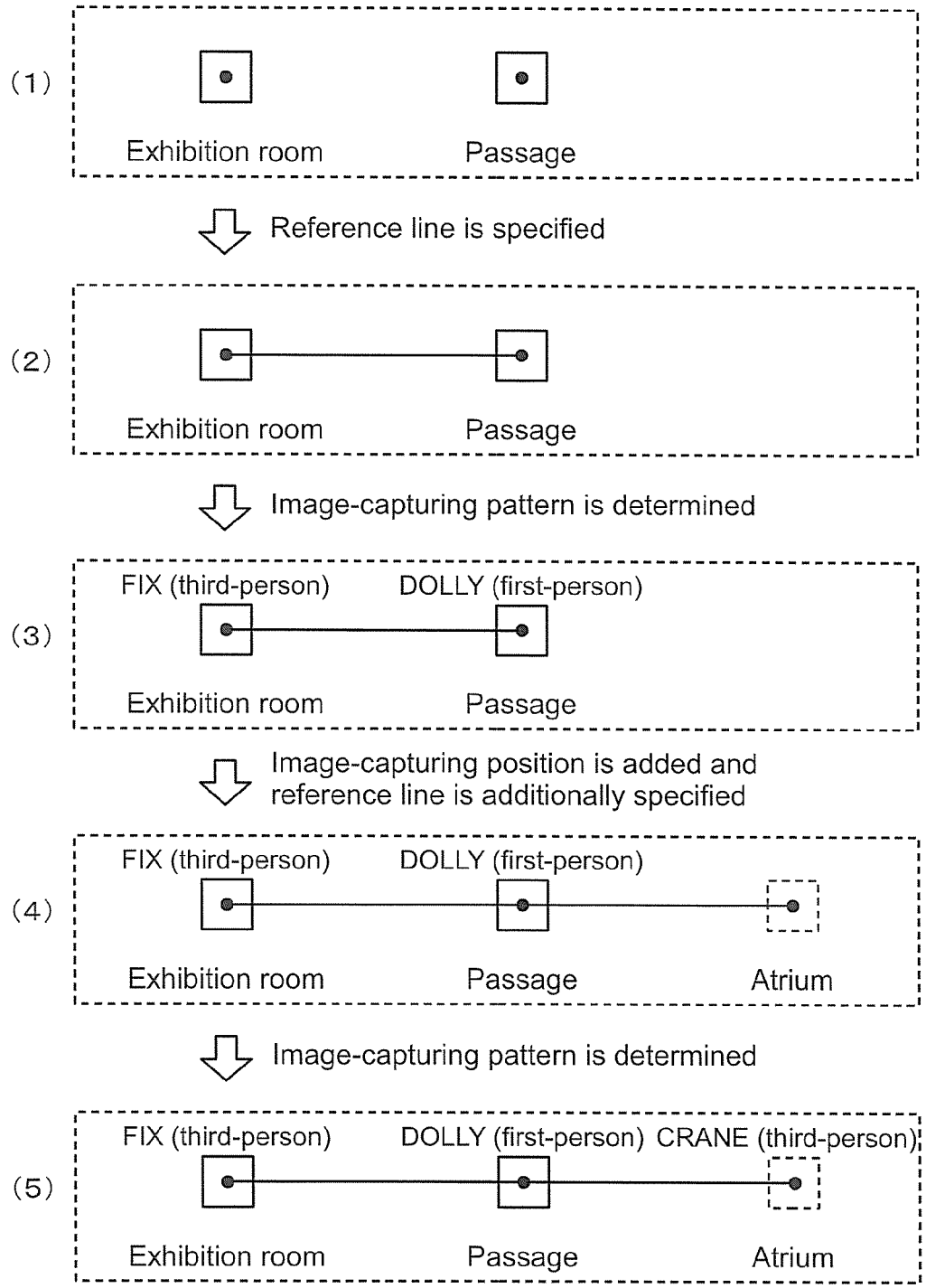
FIG. 10 shows a diagram (Part 2) for explaining an example of a generated video image according to the first exemplary embodiment.
Figure 11:
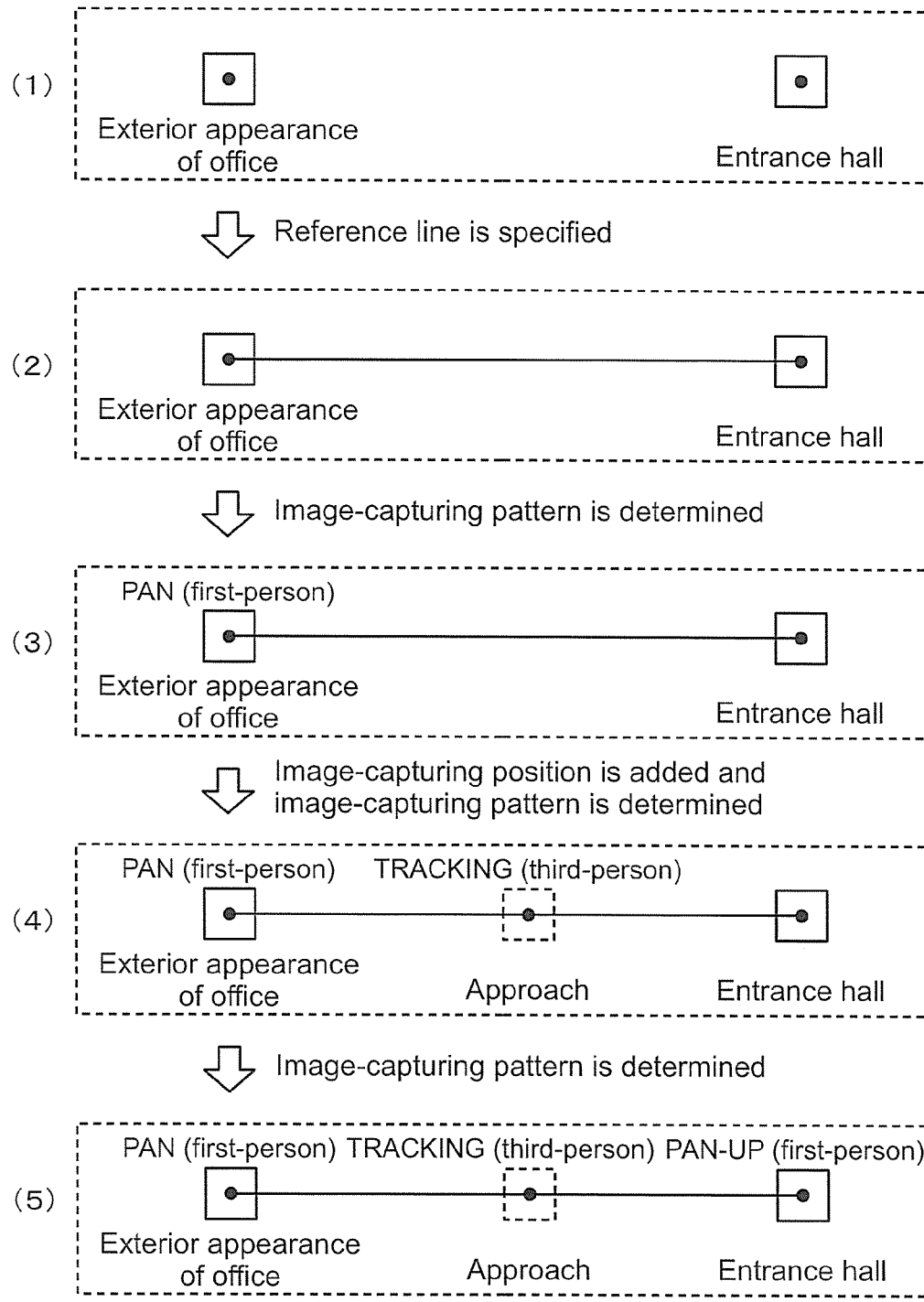
FIG. 11 shows a diagram (Part 3) for explaining an example of a generated video image according to the first exemplary embodiment.

Next, an example of generating the video image is explained. FIGS. 9 to 11 show diagrams for explaining examples of generating video images according to the present exemplary embodiment. It should be noted that an object Ob1 shown in FIG. 9 surrounded by a solid line shows a previously designated space and an object Ob2 surrounded by a broken line shows a newly specified space. In FIGS. 10 and 11, an object surrounded by a solid line also shows a previously designated space, and an object surrounded by a broken line also shows a newly specified space.

First, an example of FIG. 9 is explained. For example, a designer or a seller of a house previously designates a perspective of only a living room space in the house (see (1) illustrated in FIG. 9). Here, because the living room space in the house and a space (a corridor) connected to the living room are two connected spaces (see (2) illustrated in FIG. 9), the specifying part 52 specifies a reference line for these two connected spaces (see (3) illustrated in FIG. 9).

Next, the camerawork information generating part 53 generates the camerawork information on the basis of the reference line and the space information corresponding to each of the two spaces for which the reference line is specified. First, the image-capturing pattern of the video image that corresponds to the living room space is determined. Here, the camerawork information generating part 53 determines the image-capturing pattern of the living room to be FIX (first person) (see (4) illustrated in FIG. 9).

Subsequently, the camerawork information generating part 53 determines the image-capturing pattern of the three continuous video images on the basis of the type of point-of-view corresponding to a shape of the space and the image-capturing pattern. For example, because the camerawork information generating part 53 determines the image-capturing pattern of the living room to be FIX (first person), the image-capturing pattern of the video image of the corridor is determined to be FIX (third person) on the basis of the type of point of view corresponding to each image-capturing pattern shown in FIG. 6 (see (1) illustrated in FIG. 9). Since the third-person point of view of this image-capturing pattern is changed with the point of view of the image-capturing pattern (first person) of the living room, the viewer feels a good rhythm and is prompted to have emotional involvement in the video image. In this manner, the camerawork information generating apparatus 1 can generate a moving image of an architectural structure in which it is easy for the viewer to recognize the space and not grow tired of watching the video image by adding the video image of the corridor to the video image of the previously designated living room.

Next, an example of FIG. 10 is explained. For example, a designer or a manager of a museum previously designates a perspective of an exhibition room space and a passage space (see (1) illustrated in FIG. 10). Here, because the exhibition room space and the passage space of the museum are two connected spaces, the specifying part 52 specifies a reference line for these two spaces (see (2) illustrated in FIG. 10).

Next, the camerawork information generating part 53 generates the camerawork information on the basis of the reference line and the space information corresponding to each of the two spaces for which the reference line is specified. First, the image-capturing pattern of the video image corresponding to the space of the exhibition room is determined.

Here, the camerawork information generating part 53 determines the image-capturing pattern of the exhibition room to be FIX (third person) and determines the image-capturing pattern of the passage space to be DOLLY (first person) (see (3) illustrated in FIG. 10).

Subsequently, the camerawork information generating part 53 adds the image-capturing position. Here, an atrium space that is adjacent to the exhibition room via a passage, which is previously designated with the perspective, is determined to be the image-capturing position (see (4) illustrated in FIG. 10). Here, the camerawork information generating part 53 determines the image-capturing positions such that all of the video images are captured to link with each other in directions towards the reference line that is specified and arranged by the specifying part 52.

Subsequently, the camerawork information generating part 53 determines the image-capturing pattern of three continuous video images on the basis of the type of point-of-view corresponding to a shape of the space and the image-capturing pattern. For example, because the camerawork information generating part 53 determines the image-capturing pattern of the exhibition room to be FIX (third person) and determines the image-capturing pattern of the video image of passage to be DOLLY (first person), the image-capturing pattern of the atrium is determined to be the image-capturing pattern in which the viewer feels a good rhythm and is prompted to have emotional involvement in the video image by changing the point of view. For example, the camerawork information generating part 53 determines the image-capturing pattern of the video image of the atrium to be CRANE (third person) (see (5) illustrated in FIG. 10). In this manner, the camerawork information generating apparatus 1 adds the video image of the atrium to the video image of the previously designated exhibition room and passage and can generate a moving image of the architectural structure in which the viewer easily recognizes the space and does not grow tired of watching the video image.

Next, an example of FIG. 11 is explained. For example, a designer or a manager of an office building previously designates a video image of an exterior appearance of an office and a perspective of an entrance hall that is an approach to the inside of the office from the outside (see (1) illustrated in FIG. 11). Here, because the space including the exterior appearance of the office and the space including the entrance hall are two connected spaces, the specifying part 52 specifies a reference line for these two spaces (see (2) illustrated in FIG. 11).

Next, the camerawork information generating part 53 generates the camerawork information on the basis of the reference line and the space information corresponding to each of the two spaces for which the reference line was specified. First, the image-capturing pattern of the video image corresponding to the exterior appearance of the office is determined. Here, the camerawork information generating part 53 determines the image-capturing pattern of the exterior appearance of the office to be PAN (first person) (see (3) illustrated in FIG. 11).

Subsequently, the camerawork information generating part 53 adds the image-capturing position. Here, the camerawork information generating part 53 determines an approach to the entrance that is adjacent to the entrance hall and that is included in the exterior appearance of the office to be the image-capturing position of the video image between the video image of the previously designated exterior appearance of the office and the video image of the entrance hall (see (4) illustrated in FIG. 11). Here, the camerawork information generating part 53 determines the image-capturing position such that all of the video images are captured in a direction towards the reference line.

Subsequently, the camerawork information generating part 53 determines the image-capturing pattern of the three subsequent video images on the basis of a shape of the space and the type of point of view corresponding to the image-capturing pattern. For example, because the camerawork information generating part 53 determines the image-capturing pattern of the exterior appearance of the office to be PAN (first person), the image-capturing pattern of the video image of the approach is determined such that the viewer can feel a good rhythm and can be prompted to have emotional involvement in the video image by changing the point of view on the basis of the type of point of view corresponding to the age-capturing pattern shown in FIG. 6. For example, the camerawork information generating part 53 determines the image-capturing pattern of the video image of the approach to be TRACKING (third person).

Subsequently, the camerawork information generating part 53 determines the image-capturing pattern of the entrance hall to be PAN-UP (first person) by the same method (see (5) illustrated in FIG. 11). In this manner, the camerawork information generating apparatus 1 can generate a moving image of the architectural structure in which the viewer easily recognizes the space and does not grow tired of watching the video image by adding the approach to the video image of the previously designated exterior appearance of the office and the entrance hall.

Figure 12:
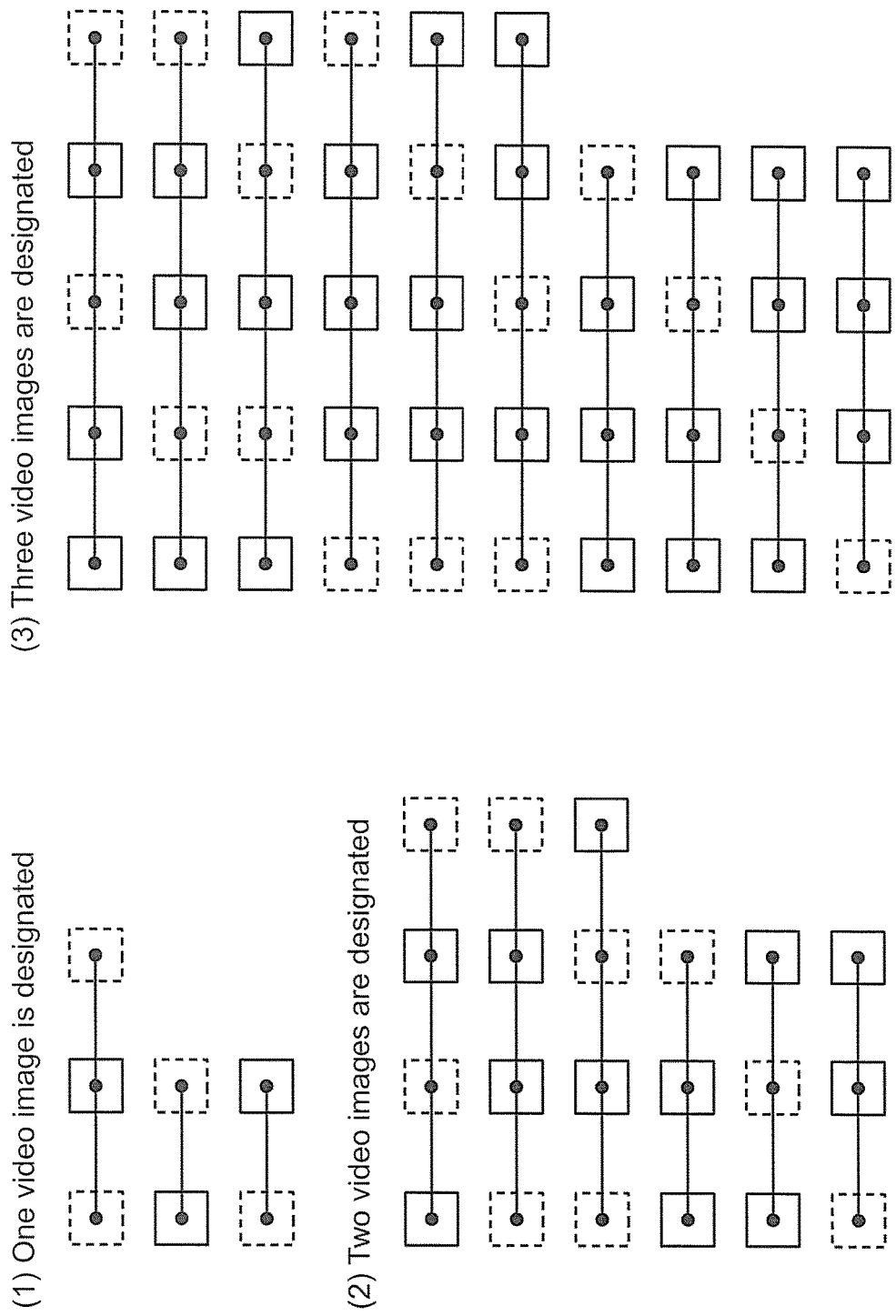
FIGS. 12A-12C show an example of an order of a previously designated video image and a newly specified video image.

It should be noted that the camerawork information generating part 53 specified a new space to be captured on the basis of one or two spaces when the one or two spaces to be captured was previously designated, but it is not limited to this. FIGS. 12A-12C show an example of an order of a previously designated video image and a newly specified video image according to the present exemplary embodiment. FIGS. 12A-12C show examples of cases where the number of previously designated space is one, two, and three. For example, one new space to be captured may be specified respectively before and after the video image corresponding to the previously designated space. FIG. 12A shows a situation where one video image is designated. FIG. 12B shows a situation where two video images are designated. FIG. 12C shows a situation where three video image are designated.

[An Effect of the First Exemplary Embodiment]

According to the first exemplary embodiment, the method for generating camerawork information generates the camerawork information showing time-series information concerning at least one of the image-capturing position, image-capturing direction, and image-capturing movement direction in the two spaces on the basis of the specified reference line and the space information corresponding to each of the two spaces for which the reference line is specified. The video image generated on the basis of the specified reference line with respect to the two spaces may be a video image that the viewers can easily comprehend. Further, the video image captured by the method for generating camerawork information allows the viewer to comprehend a space configuration configured by an architectural structure, allows features of a space designed by a designer, the emotion of the designer put in the space, and a concept that a designer of the video image of the space wishes to convey to the viewer to be easily conveyed to the viewer, and allows the viewer to have emotional involvement in the video image.

Second Exemplary Embodiment

[A Reference Line that is Parallel to a Wall Face is Specified]

Next, the second exemplary embodiment is explained. In the first exemplary embodiment, the specifying part 52 specifies the reference line that passes through the centroids of each of the two connected spaces. On the other hand, the second exemplary embodiment is different from the first exemplary embodiment in that the specifying part 52 specifies a reference line that is parallel to a wall face. The second exemplary embodiment is explained below with reference to figures. It should be noted that the same reference numeral is given to the configurations similar to those in the first exemplary embodiment and the detailed explanations of them are omitted.

Figure 13:
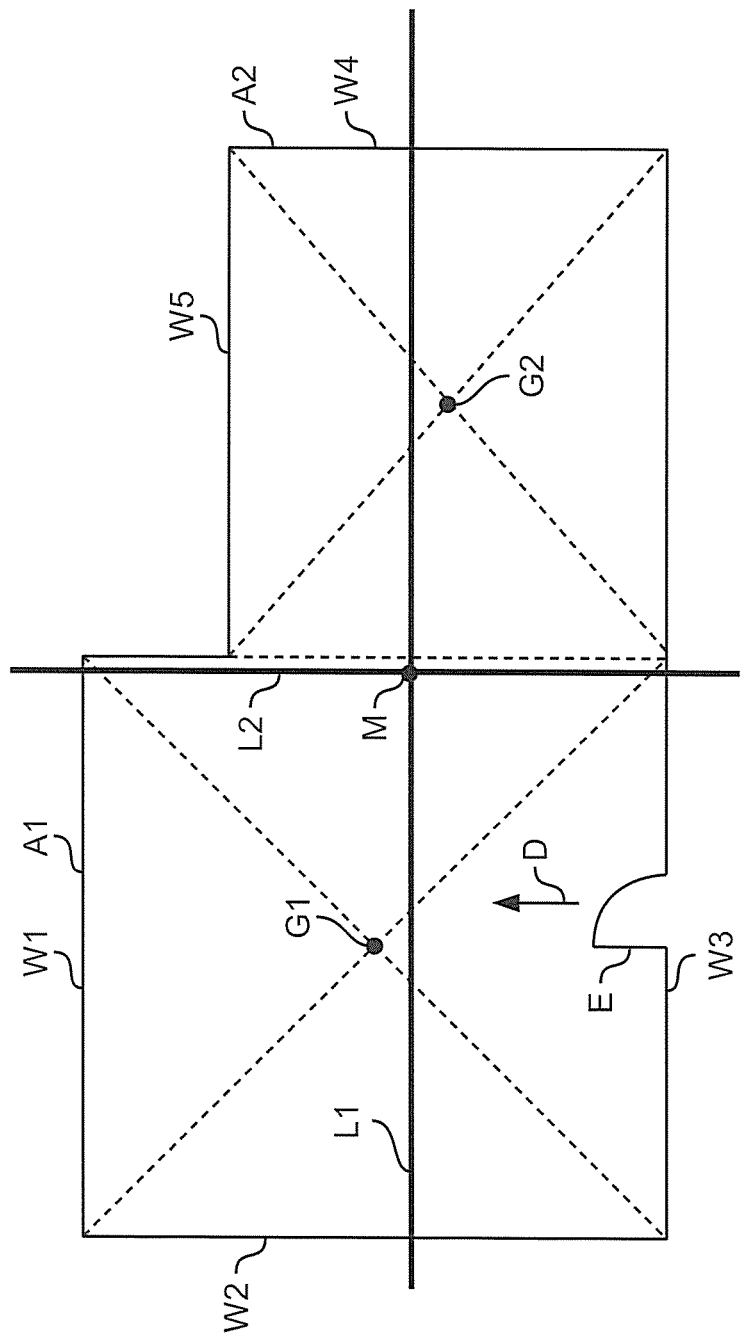
FIG. 13 shows a diagram for explaining a method for specifying a reference line according to the second exemplary embodiment.

FIG. 13 shows a diagram for explaining a method for specifying a reference line according to the second exemplary embodiment. In the second exemplary embodiment, the specifying part 52 specifies a line that passes between a centroid in a first space and a centroid in a second space in the two connected spaces and that is parallel to any one of a plurality of wall faces defining the two spaces as a reference line.

In the example shown in FIG. 13, the specifying part 52 specifies a line that passes through a midpoint M between a centroid G1 in a first area A1 and a centroid G2 in a second area A2, and that is parallel to any one of walls W1 to W5 that correspond to side faces of the first area A1 and the second area A2 that are two connected spaces. In FIG. 13, since the wall faces W1, W3, and W5 are parallel to each other and the wall faces W2 and W4 are parallel to each other, the specifying part 52 specifies two reference lines L1 and L2.

Further, the specifying part 52 may specify a line that is orthogonal to a direction of entering the two spaces from an external space, from among the lines that pass between the centroid in the first space and the centroid in the second space and that are parallel to the wall faces defining two spaces, as the reference line. For example, in an example shown in FIG. 13, the specifying part 52 specifies the line L1 that is orthogonal to a forward direction D of entering from an external space through an entrance E as the reference line.

It should be noted that the specifying part 52 may assume that the two connected spaces are one space and may set a centroid in the one space. For example, the specifying part 52 may assume the two connected spaces to be one rectangular space. FIG. 14 shows an example that the first space A1 and the second space A2 that are two connected spaces are assumed as one space A12. In the example shown in FIG. 14, the specifying part 52 sets a centroid G12 corresponding to the one space A12. Then, as shown in FIG. 14, the specifying part 52 calculates a centroid G12 in the one space A12 and a centroid G3 in other space A3 (i) that is adjacent to the connected first space A1 and second space A2 and (ii) into which a person can move from at least one of the first space A1 and the second space A2. Also, the specifying part 52 specifies lines L3 and L4 that pass between the centroid G12 and the centroid G3, and that are parallel to any one of the wall faces that define the one space A12 or the other space A3 as the reference line.

Further, the specifying part 52 may divide one space into two connected spaces, and may specify a line (i) that passes between a centroid in the one space and a centroid in another space that is adjacent to the two connected spaces and into which a person can move from the two connected spaces, and (ii) that is parallel to any one of wall faces that define the first space and the another space as a reference line. In this manner, by assuming that a room with a complicated shape and an outside space are one space, the reference line can be specified by calculating a centroid in the one space.

Further, when a front direction of an architectural structure is specified, the specifying part 52 may specify a line that is parallel to a wall face corresponding to the front direction as a reference line. The architectural structure for which a front direction is specified is, for example, a theater, a classroom, or a church. For example, the specifying part 52 identifies a name of the architectural structure from design information of the architectural structure such as a three-dimensional CAD and BIM. Then, when a specific keyword such as a theater or a church is included, the specifying part 52 specifies a side of the architectural structure facing a road as the front direction and sets a reference line on the basis of the front direction. Because the architectural structure for which front direction is specified is likely to have a distinctive structure with respect to the front direction and a person who sees the architectural structure is likely to recognize the coordinate system, camerawork information suitable for the architectural structure can be generated by specifying a line parallel to the wall faces that correspond to the front direction as a reference line and by focusing on the architectural structure configuration.

Furthermore, when the camerawork information for which the image-capturing direction in the generating step varies by a predetermined amount is generated, the specifying part 52 may specify a line that passes between the centroids in the two spaces and that is orthogonal to the specified reference line as a new reference line.

For example, in the example shown in FIG. 13, the camerawork information generated by the camerawork information generating part 53 on the basis of the reference line L1 is assumed to be the camerawork information of an image-capturing pattern (for example, PAN and DOLLY including a predetermined amount of variance in the angle) in which image-capturing direction varies by a predetermined amount or more. In this case, the specifying part 52 specifies the line L2 that is orthogonal to the reference line L1 as a new reference line L2. Then, the camerawork information generating part 53 generates the camerawork information on the basis of the reference line L2. It should be noted that the line L2 that is orthogonal to the reference line L1 may be specified as the new reference line L2 when the image-capturing direction shown by the camerawork information newly generated by the camerawork information generating part 53 on the basis of the reference line L1 varies by the predetermined amount or more from the image-capturing direction shown by the camerawork information generated immediately before on the basis of the reference line L1.

In this manner, because a plurality of video images captured by the camerawork information based on the reference lines L1 and L2 that are parallel to the wall faces can be combined, even when the relation between the wall faces and the reference lines significantly changes, the comprehensibility of the video image can be maintained by making all directions of the space that the viewer experiences from the video image captured by the camerawork information match with all directions of the cognitive map of the viewer.

[An Effect of the Second Exemplary Embodiment]

As described above, the specifying part 52 according to the second exemplary embodiment specifies the line that passes between the centroid in the first space and the centroid in the second space in the two spaces and is parallel to any one of a plurality of wall faces defining the two spaces as a reference line. In this manner, a video image captured by camerawork information based on the reference line is a coordinate system configured by the wall faces and the reference line. Hence, all directions of the space that the viewer experiences from the video image are easily matched with all direction of the cognitive map of the viewer and the video image allows the viewer to easily comprehend the coordinate system of the space. Accordingly, the camerawork information generating apparatus 1 can generate camerawork information for improving comprehension of the viewer with respect to the video image of a space configuration configured by architectural structures.

The present invention is described with the exemplary embodiments of the present invention but the technical scope of the present invention is not limited to the scope described in the above embodiment. It is apparent for those skilled in the art that it is possible to make various changes and modifications to the embodiment. For example, before the extracting step of the above-mentioned exemplary embodiment, a space outline model (3D object) showing coordinate information of a space may be generated by the three-dimensional CG program, and a process corresponding to the extracting step, the specifying step, the generating step, and the video image generating step may be executed in the three-dimensional CG program. Further, a process corresponding to the extracting step, the specifying step, the generating step, and the video image generating step may be executed by using numerous pieces of information that specify the space without making the space model in the three-dimensional CG program.

What is claimed is:

1. A method for generating camerawork infatuation, comprising steps of:
    extracting, from design information of an architectural structure, a plurality of pieces of space information showing a plurality of spaces related to the architectural structure;
    specifying a reference line that passes through two connected spaces included in a space shown by a plurality of pieces of extracted space information, the reference line being a reference when a video image is configured; and generating camerawork information that shows time-series information concerning at least one of an image-capturing position, an image-capturing direction, and an image-capturing movement direction in the two spaces, on the basis of the specified reference line and space information corresponding to each of the two spaces for which the reference line is specified, wherein the step of specifying includes specifying, as the reference line, a line that is orthogonal to a direction of entering the two spaces from an external space, from among the lines that pass between the centroid in the first space and the centroid in the second space and that are parallel to wall faces defining the two spaces.

2. The method for generating camerawork information according to claim 1, wherein the step of specifying includes:

assuming two connected spaces to be one space, and specifying, as a reference line, a line (i) that passes between a centroid in the one space and a centroid in another space that is adjacent to the two connected spaces and into which a person can move from the two connected spaces, and (ii) that is parallel to any one of the wall faces defining the first space and the other space.

3. The method for generating camerawork information according to claim 1, wherein the step of specifying includes:

dividing one space into two connected spaces, and specifying, as the reference line, a line (i) that passes between a centroid in the one space and a centroid in another space that is adjacent to the two connected spaces and into which a person can move from the two connected spaces, and (ii) that is parallel to any of wall faces defining the first space and the other space.

4. The method for generating camerawork information according to claim 1, wherein the step of specifying includes specifying, as the reference line, a line that is parallel to a wall face corresponding to a front direction, when the front direction of an architectural structure is specified.

5. The method for generating camerawork information according to claim 1, wherein the step of generating includes generating the camerawork information that contains the plurality of image-capturing positions on the same side, with the reference line as a reference.

6. The method for generating camerawork information according to claim 5, wherein the step of generating includes generating the camerawork information containing an image-capturing position that is equal to or farther than the predetermined range with respect to the image-capturing position of a capturing performed immediately before.

7. The method for generating camerawork information according to claim 5, wherein the step of generating includes generating the camerawork information containing an image-capturing direction that is equal to or farther than the predetermined range with respect to the image-capturing direction of a capturing performed immediately before.

8. The method for generating camerawork information according to claim 5, wherein the step of generating includes generating the camerawork information containing a direction from the image-capturing position towards the reference line as the image-capturing direction of a plurality of continuous capturings.

9. The method for generating camerawork information according to claim 5, wherein the step of generating includes generating the camerawork information containing a horizontal angle that is within a predetermined angle with respect to a horizontal angle of a capturing performed immediately before.

10. The method for generating camerawork information according to claim 5, wherein the step of generating includes generating the camerawork information such that video images captured at the same height do not continue for a predetermined number of times or more with respect to video images captured from a plurality of image-capturing positions.

11. The method for generating camerawork information according to claim 1, wherein the step of generating includes:

specifying a position within a predetermined distance from the reference line as an image-capturing start position.

12. The method for generating camerawork information according to claim 1, wherein the step of generating includes:

generating the camerawork information of the camera object for rendering computer graphics of a space model, the camerawork information of the camera object being provided to the space model generated by a three-dimensional computer graphics program.

13. An apparatus for generating camerawork information comprising:

an extracting part that extracts, from design information of an architectural structure, a plurality of pieces of space information showing a plurality of spaces related to the architectural structure;

a specifying part that specifies a reference line that passes through two connected spaces included in a space shown by the plurality of pieces of extracted space information, the reference line being a reference when a video image is configured; and a generating part that generates camerawork information showing pieces of time-series information concerning at least one of an image-capturing position, an image-capturing direction, and an image-capturing movement direction in the two spaces, on the basis of the specified reference line and the space information corresponding to each of the two spaces for which the reference line is specified, wherein the specifying part is further configured to specify, as the reference line, a line that is orthogonal to a direction of entering the two spaces from an external space, from among the lines that pass between the centroid in the first space and the centroid in the second space and that are parallel to wall faces defining the two spaces.

14. A non-transitory computer-readable medium storing a camerawork information generating program that causes a computer to:

extract, from design information of an architectural structure, a plurality of pieces of space information showing a plurality of spaces related to the architectural structure, specify a reference line that passes through two connected spaces included in a space shown by the plurality of pieces of extracted space information, the reference line being a reference when a video image is configured, and generate camerawork information showing time-series information concerning at least one of an image-capturing position, an image-capturing direction, and an image-capturing movement direction in the two spaces, on the basis of the specified reference line and the space information corresponding to each of the two spaces for which the reference line is specified, wherein the computer is further configured to specify, as the reference line, a line that is orthogonal to a direction of entering the two spaces from an external space, from among the lines that pass between the centroid in the first space and the centroid in the second space and that are parallel to wall faces defining the two spaces.

15. A method for generating camerawork information, comprising steps of:

extracting, from design information of an architectural structure, a plurality of pieces of space information showing a plurality of spaces related to the architectural structure;

specifying a reference line that passes through two connected spaces included in a space shown by a plurality of pieces of extracted space information, the reference line being a reference when a video image is configured; and generating camerawork information that shows time-series information concerning at least one of an image-capturing position, an image-capturing direction, and an image-capturing movement direction in the two spaces, on the basis of the specified reference line and space information corresponding to each of the two spaces for which the reference line is specified, wherein the step of specifying includes specifying, as the reference line, a line that passes between a centroid in a first space and a centroid in a second space in the two spaces and that is parallel to any one of a plurality of wall faces defining the two spaces, wherein the step of specifying includes specifying, as a new reference line, a line that passes between the two centroids and that is orthogonal to the specified reference line, when the camerawork information is generated in which the image-capturing direction in the generating varies by a predetermined amount.

16. A method for generating camerawork information, comprising steps of:

extracting, from design information of an architectural structure, a plurality of pieces of space information showing a plurality of spaces related to the architectural structure;

specifying a reference line that passes through two connected spaces included in a space shown by a plurality of pieces of extracted space information, the reference line being a reference when a video image is configured; and generating camerawork information that shows time-series information concerning at least one of an image-capturing position, an image-capturing direction, and an image-capturing movement direction in the two spaces, on the basis of the specified reference line and space information corresponding to each of the two spaces for which the reference line is specified, wherein the step of generating includes:

selecting one pattern from a plurality of previously specified image-capturing patterns showing a variation pattern of at least one of the image-capturing position, the image-capturing direction, and the image-capturing movement direction on the basis of shapes of the two spaces for which the reference line is specified, and generating the camerawork information on the basis of the selected image-capturing pattern and the reference line.

17. A method for generating camerawork information, comprising steps of:

extracting, from design information of an architectural structure, a plurality of pieces of space information showing a plurality of spaces related to the architectural structure;

specifying a reference line that passes through two connected spaces included in a space shown by a plurality of pieces of extracted space information, the reference line being a reference when a video image is configured; and generating camerawork information that shows time-series information concerning at least one of an image-capturing position, an image-capturing direction, and an image-capturing movement direction in the two spaces, on the basis of the specified reference line and space information corresponding to each of the two spaces for which the reference line is specified, wherein the step of generating includes:

selecting one pattern from a plurality of previously specified image-capturing patterns showing a variation pattern of at least one of the image-capturing position, the image-capturing direction, and the image-capturing movement direction on the basis of the type of point of view associated with the image-capturing patterns, and generating the camerawork information on the basis of the selected image-capturing pattern and the reference line.

18. A method for generating camerawork information, comprising steps of:

extracting, from design information of an architectural structure, a plurality of pieces of space information showing a plurality of spaces related to the architectural structure;

specifying a reference line that passes through two connected spaces included in a space shown by a plurality of pieces of extracted space information, the reference line being a reference when a video image is configured; and generating camerawork information that shows time-series information concerning at least one of an image-capturing position, an image-capturing direction, and an image-capturing movement direction in the two spaces, on the basis of the specified reference line and space information corresponding to each of the two spaces for which the reference line is specified, wherein the step of generating includes generating the camerawork information on the basis of an action of a viewer, the action being specified on the basis of the viewing log obtained by a wearable computer.

* * * * *